(12) United States Patent
Tseng et al.

(10) Patent No.: US 8,598,463 B2
(45) Date of Patent: Dec. 3, 2013

(54) CIRCUIT BOARD AND MANUFACTURING METHOD THEREOF

(75) Inventors: Tzyy-Jang Tseng, Hsinchu (TW); Chang-Ming Lee, Taoyuan County (TW); Wen-Fang Liu, Taoyuan County (TW); Cheng-Po Yu, Taoyuan County (TW)

(73) Assignee: Unimicron Technology Corp., Taoyuan (TW)

( * ) Notice: Subject to any disclaimer, the term of this patent is extended or adjusted under 35 U.S.C. 154(b) by 237 days.

(21) Appl. No.: 13/050,009

(22) Filed: Mar. 17, 2011

(65) Prior Publication Data

US 2012/0031652 A1 Feb. 9, 2012

Related U.S. Application Data

(63) Continuation-in-part of application No. 12/944,275, filed on Nov. 11, 2010.

(30) Foreign Application Priority Data

Aug. 5, 2010 (TW) ............................. 99215014 U
Nov. 23, 2010 (TW) ............................. 99140396 A

(51) Int. Cl.
   *H05K 1/00* (2006.01)
   *C23C 18/16* (2006.01)

(52) U.S. Cl.
   CPC ................................ *C23C 18/165* (2013.01)
   USPC ........................................ 174/252; 174/258

(58) Field of Classification Search
   CPC .... C23C 18/605; C25D 5/022; H05K 1/0203; H05K 1/056; H05K 3/3436; H05K 2201/0187
   USPC .......... 174/252, 256, 258–266; 156/280, 247; 361/748, 760
   See application file for complete search history.

(56) References Cited

U.S. PATENT DOCUMENTS

| | | | |
|---|---|---|---|
| 6,570,099 B1 | 5/2003 | Hirano et al. | |
| 2005/0167792 A1* | 8/2005 | Miyai et al. | 257/668 |
| 2006/0109632 A1* | 5/2006 | Berlin et al. | 361/719 |
| 2007/0035013 A1 | 2/2007 | Handa et al. | |
| 2009/0267093 A1* | 10/2009 | Kamada et al. | 257/98 |
| 2011/0157858 A1* | 6/2011 | Jung et al. | 361/803 |

FOREIGN PATENT DOCUMENTS

| | | |
|---|---|---|
| JP | 60171792 | 9/1985 |
| JP | 62125691 | 6/1987 |
| JP | 2129989 | 5/1990 |
| JP | 4180689 | 6/1992 |
| JP | 4180690 | 6/1992 |
| JP | 8236884 | 9/1996 |
| JP | 2000124568 | 4/2000 |

(Continued)

*Primary Examiner* — Yuriy Semenenko
(74) *Attorney, Agent, or Firm* — Rosenberg, Klein & Lee

(57) ABSTRACT

A circuit board includes a metal pattern layer, a thermally conductive plate, an electrically insulating layer, and at least one electrically insulating material. The thermally conductive plate has a plane. The electrically insulating layer is disposed between the metal pattern layer and the plane and partially covers the plane. The electrically insulating material covers the plane where is not covered by the electrically insulating layer and touches the thermally conductive plate. The electrically insulating layer exposes the electrically insulating material, and a thermal conductivity of the electrically insulating material is larger than a thermal conductivity of the electrically insulating layer.

11 Claims, 4 Drawing Sheets

(56) References Cited

FOREIGN PATENT DOCUMENTS

| | | |
|---|---|---|
| JP | 2005064168 | 3/2005 |
| TW | 461060 | 10/2001 |
| TW | 200742122 | 11/2007 |
| TW | M354036 | 4/2009 |
| TW | 200941658 | 10/2009 |
| TW | M373629 | 2/2010 |

* cited by examiner

CIRCUIT BOARD AND MANUFACTURING METHOD THEREOF

CROSS-REFERENCE TO RELATED APPLICATION

This application claims the benefit of Taiwan Patent Application No. 099215014, filed on Aug. 5, 2010, Taiwan Patent Application No. 099140396, filed on Nov. 23, 2010 and prior U.S. patent application Ser. No. 12/944,275, filed on Nov. 11, 2010 which are hereby incorporated by reference for all purposes as if fully set forth herein.

BACKGROUND OF THE INVENTION

1. Field of Invention

The present invention relates to a circuit board and a manufacturing method thereof, and more particularly, to a circuit board that can accelerate the thermal energy transfer rate and a manufacturing method thereof.

2. Related Art

The current electronic devices, such as mobile phones and computers, and the household appliances, such as televisions and refrigerators, include a plurality of electronic components, for example, active components or passive components. Most of the electronic components are mounted on a circuit substrate, and the electronic components output and receive electrical signals by using the circuitry of the circuit substrate. Thus, the electrical signals can be transmitted among the electronic components.

However, the electronic components will generate some thermal energy during the operation, and some electronic components, such as light-emitting diodes (LEDs) and power components, even generate a large amount of thermal energy during the operation. Therefore, how to accelerate the thermal energy transfer rate of the electronic components is a subject worth studying.

SUMMARY OF THE INVENTION

The present invention is directed to a circuit board enabling to accelerate the thermal energy transfer rate of electronic components.

The present invention is directed to a manufacturing method for manufacturing the circuit board.

The present invention provides a circuit board including a metal pattern layer, a thermally conductive plate, an electrically insulating layer, and at least one electrically insulating material. The thermally conductive plate has a plane. The electrically insulating layer is disposed between the metal pattern layer and the plane and partially covers the plane. The electrically insulating material covers the plane where is not covered by the electrically insulating layer, and touches the thermally conductive plate. The electrically insulating layer exposes the electrically insulating material, and a thermal conductivity of the electrically insulating material is larger than the thermal conductivity of the electrically insulating layer.

The present invention provides a manufacturing method of a circuit board. In the manufacturing method, an electrically insulating layer and at least one electrically insulating material are formed on a plane of a thermally conductive plate, and a metal pattern layer located on the electrically insulating layer is formed. The electrically insulating layer partially covers the plane, and the electrically insulating material covers the plane where is not covered by the electrically insulating layer. The electrically insulating material touches the thermally conductive plate. A thermal conductivity of the electrically insulating material is larger than that of the electrically insulating layer.

Based on the above, the thermal conductivity of the electrically insulating material is larger than the thermal conductivity of the electrically insulating layer, and the electrically insulating material covers the plane where is not covered by the electrically insulating layer and touches the thermally conductive substrate, so that the electrically insulating material and the thermally conductive substrate can accelerate the thermal energy transfer rate when operating electronic components generate thermal energy.

To make the features and advantages of the present invention more clear and understandable, the present invention will be described below in great detail through the embodiments in combination with the accompanying drawings.

BRIEF DESCRIPTION OF THE DRAWINGS

The present invention will become more fully understood from the detailed description given herein below for example only, and thus are not limitative of the present invention, and wherein.

DETAILED DESCRIPTION OF THE INVENTION

Figure 1:
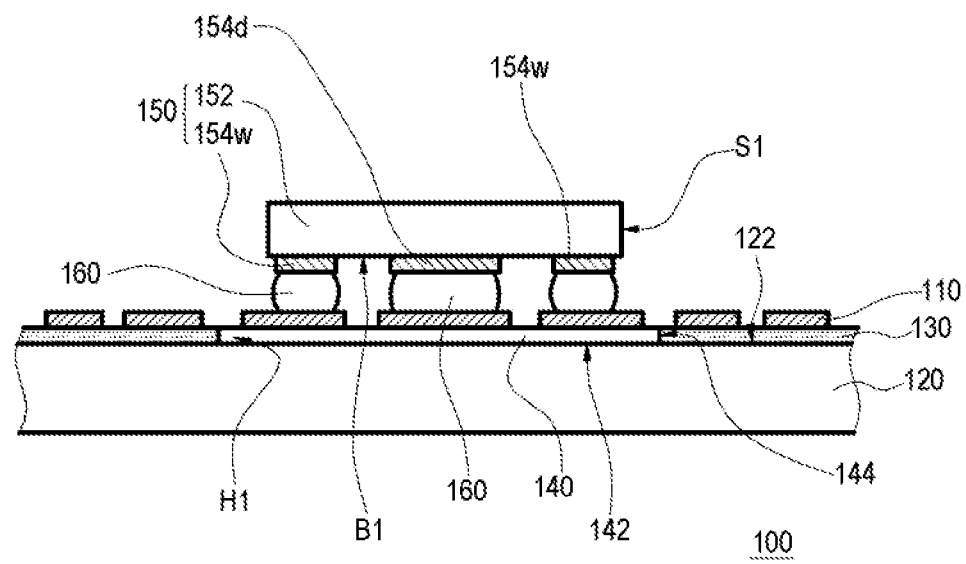
FIG. 1 is a cross-sectional schematic view of a circuit board according to an embodiment of the present invention.

FIG. 1 is a cross-sectional schematic view of a circuit board according to an embodiment of the present invention. Referring to FIG. 1, a circuit board 100 includes a metal pattern layer 110, a thermally conductive plate 120, an electrically insulating layer 130, and an electrically insulating material 140. The thermally conductive plate 120 has a plane 122, and both the electrically insulating layer 130 and the electrically insulating material 140 are disposed between the metal pattern layer 110 and the plane 122.

The electrically insulating layer 130 partially covers the plane 122, that is, the electrically insulating layer 130 does not completely cover the plane 122, and a part of the plane 122 is not covered by the electrically insulating layer 130. The electrically insulating material 140 covers the plane 122 where is not covered by the electrically insulating layer 130, and the electrically insulating layer 130 exposes the electrically insulating material 140. The electrically insulating material 140 touches the thermally conductive plate 120 and further touches the metal pattern layer 110, and thus can be thermally coupled to the thermally conductive plate 120 and the metal pattern layer 110. Therefore, thermal energy can be transferred between the electrically insulating material 140 and the thermally conductive plate 120 in the manner of thermal conduction.

The thermally conductive plate 120 has a high thermal conductivity, for example, larger than 1 W/MK. The thermally conductive plate 120 may be a metal plate or a carbon-material board. The carbon-material board generally refers to a plate made of carbon, such as a carbon fiber plate or a graphite plate. The metal plate may be an alloy plate or a plate substantially made of a single kind of metal, such as an aluminum-magnesium alloy plate, aluminum plate, or copper plate.

The electrically insulating material 140 may be a ceramic layer, thermal pad, or thermal adhesive layer, in which the thermal pad is a solid. The thermal adhesive layer generally refers to a film formed of an adhesive having a high thermal conductivity, such as a thermal adhesive, in which the thermal adhesive may be in liquid state or colloidal state. In addition, both the thermal pad and the thermal adhesive may include a plurality of particles having a capability of high thermal conductivity, such as a metal particle, carbon powder, or silicon carbide (SiC) powder.

It should be noted that, although FIG. 1 only depicts one electrically insulating material 140, in other embodiment, the circuit board 100 may include a plurality of electrically insulating materials 140. In other words, one or more electrically insulating materials 140 may be included by the circuit board 100. Therefore, the number of the electrically insulating material 140 shown in FIG. 1 is only for example and does not limit the present invention.

The thermal conductivity of the electrically insulating material 140 is larger than the thermal conductivity of the electrically insulating layer 130 so that the thermal energy transfer rate of the electrically insulating material 140 will be larger than the thermal energy transfer rate of the electrically insulating layer 130, in which the thermal conductivity of the electrically insulating layer 130 may be lower than 1 W/MK. For example, the thermal conductivity of the electrically insulating layer 130 may be between 0.3 W/MK and 0.5 W/MK, and the thermal conductivity of the electrically insulating material 140 may be larger than 2.0 W/MK. It should be noted that the thermal conductivity mentioned in the present invention is obtained at an absolute temperature of 300K. In addition, both the electrically insulating layer 130 and the electrically insulating material 140 may be formed in the manner of laminating or printing.

When the electrically insulating layer 130 and the electrically insulating material 140 are formed in the manner of laminating, the electrically insulating layer 130 may be a prepreg, and the electrically insulating material 140 may be a thermal pad, that is, both the electrically insulating layer 130 and the electrically insulating material 140 may be formed by laminating the prepreg and the thermal pad. In addition, before laminating the prepreg, the prepreg may be punched, routed, or laser-ablated, thereby forming an opening H1 in the electrically insulating layer 130 and making the thermal pad disposed in the opening H1.

When the electrically insulating layer 130 and the electrically insulating material 140 are formed in the manner of printing, the electrically insulating material 140 may be a ceramic layer or a thermal adhesive layer. The electrically insulating layer 130 and the electrically insulating material 140 may be formed by applying a liquid, colloidal, or paste-like coating. The coating may be resin or a coating containing resin. In addition, when the electrically insulating layer 130 and the electrically insulating material 140 are formed in the manner of printing, after the coating is applied, the coating may be heated and dried or illuminated by light to cure the coating, in which the light may be ultraviolet light.

The circuit board 100 may further include an electronic component 150, such as a light-emitting diode, a power component, a die package, or a die. The electronic component 150 includes a component main body 152 and a plurality of pads 154d and 154w. The component main body 152 has a bottom surface B1, and the pads 154d and 154w are disposed on the bottom surface B1. The pad 154d may be a dummy pad, and the pad 154w may be a working pad. When the electronic component 150 is in operation, a current may just pass through the pad 154w without passing through the pad 154d.

It should be noted that, Although FIG. 1 only depicts one electronic component 150, in other embodiment, the circuit board 100 may include a plurality of electronic components 150. That is to say, one or more electronic components 150 may be included by the circuit board 100. Therefore, the number of the electronic component 150 shown in FIG. 1 is only for example and does not limit the present invention.

The electronic component 150 may be electrically connected to the metal pattern layer 110 in the manner of flip chip, as shown in FIG. 1. Particularly, the circuit board 100 may further include a plurality of solders 160 connected to the electronic component 150 and the thermally conductive plate 120. Each solder 160 is connected to one of the pads 154w or 154d, and the solders 160 touch the pads 154w and 154d and the metal pattern layer 110. Therefore, the pads 154w and 154d may be electrically connected to the metal pattern layer 110 through the solders 160 and may further be thermally coupled to the electrically insulating material 140 through the solders 160 and the metal pattern layer 110.

In the embodiment in FIG. 1, the pads 154w and 154d are thermally coupled to the electrically insulating material 140 through the solders 160 and the metal pattern layer 110. However, in other embodiment, when the pad 154d is a dummy pad, the pad 154d may be thermally coupled to the electrically insulating material 140 through the solders 160 without the metal pattern layer 110, and the pad 154d even may directly touch the electrically insulating material 140, instead of being thermally coupled to the electrically insulating material 140 through the solders 160. Therefore, even if there are no solder 160 existing, and electrically insulating material 140 does not touch the metal pattern layer 110, the pad 154d also may be directly thermally coupled to the electrically insulating material 140.

Based on the above, the pads 154w and 154d are thermally coupled to the electrically insulating material 140, and the electrically insulating material 140 is thermally coupled to the thermally conductive plate 120, so that the electrically insulating material 140 and the thermally conductive plate 120 can accelerate the thermal energy transfer rate, thereby reducing the probability that the electronic component 150 is overheating when the operating electronic component 150 generates thermal energy.

In addition, the electrically insulating material 140 covers the plane 122 where is not covered by the electrically insulating layer 130, and the electrically insulating material 140 is exposed by the electrically insulating layer 130, so the electrically insulating material 140 does not completely cover the plane 122 of the thermally conductive plate 120, thereby enabling to limit the amount of usage of the electrically insulating material 140 for the circuit board 100. Moreover, the material cost of the electrically insulating material 140 with a high thermal conductivity is usually higher than the material cost of the electrically insulating layer 130 with a small thermal conductivity. Therefore, since the amount of usage of the electrically insulating material 140 can cant be limited, the overall manufacturing cost of the circuit board 100 in this embodiment can be reduced.

It should be noted that, in addition to the flip chip, the electronic component 150 also may be electrically connected to the metal pattern layer 110 in other manners. For example, the electronic component 150 may be electrically connected to the metal pattern layer 110 in the manner of wire bonding. Therefore, the manner of electrical connection between the electronic component 150 and the metal pattern layer 110 shown in FIG. 1 is only for example and does not limit the present invention.

The component main body 152 further has a side surface S1 connected to the bottom surface B1. The electrically insulating material 140 has a contact surface 142 touching the thermally conductive plate 120 and a side edge 144 connected to the contact surface 142. The area of the bottom surface B1 may be smaller than the area of the plane 122 covered by the electrically insulating material 140, that is, the area of the bottom surface B1 may be smaller than the area of the contact surface 142.

Further, in this embodiment, the electrically insulating material 140 may protrude from the side surface S1, and the component main body 152 may not protrude from the side edge 144. Thus, the component main body 152 may be completely located within the contact surface 142. Most of the thermal energy from the electronic component 150 is transferred by the pads 154w and 154d, the solders 160, and the electrically insulating material 140, so as to reduce the probability that the electronic component 150 is overheating.

Figure 2:
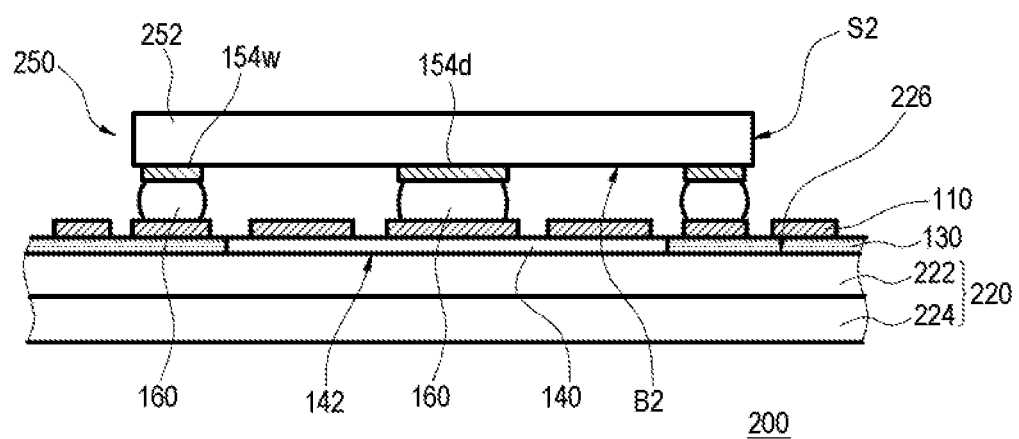
FIG. 2 is a cross-sectional schematic view of a circuit board according to another embodiment of the present invention.

FIG. 2 is a cross-sectional schematic view of a circuit board according to another embodiment of the present invention. Referring to FIG. 2, a circuit board 200 in this embodiment is similar to the circuit board 100 in the above embodiment. For example, both of the circuit board 100 and the circuit board 200 include some identical components, and the difference between the two only lies in a thermally conductive plate 220 and an electronic component 250 included by the circuit board 200.

Particularly, the thermally conductive plate 220 has a multilayer structure, and a component main body 252 included by the electronic component 250 has a bottom surface B2 and a side surface S2 connected to the bottom surface B2. The area of the bottom surface B2 is larger than the area of the plane 226 covered by the electrically insulating material 140, that is, the area of the bottom surface B2 is larger than the area of the contact surface 142, and the electrically insulating material 140 does not protrude from the side surface S2 of the component main body 252.

The thermally conductive plate 220 includes a thermally conductive layer 222 and a main body layer 224. The thermally conductive layer 222 is located between the main body layer 224 and the electrically insulating layer 130 and touches the electrically insulating material 140. The thermally conductive layer 222 has a high thermal conductivity, for example, higher than 1 W/MK. The thermally conductive layer 222 may be a metal layer or a carbon-material layer. The carbon-material layer generally refers to a film mainly formed by carbon, such as a carbon fiber layer, a graphite layer, or a diamond film. Therefore, the thermally conductive plate 220 also can accelerate the thermal energy transfer rate, so as to reduce the probability that the electronic component 250 is overheating.

It should be noted that, the electronic component 250 further includes a plurality of pads 154d and 154w, and only one pad 154d is thermally coupled to the electrically insulating material 140, as shown in FIG. 2. However, both the pads 154w and 154d also can be thermally coupled to the electrically insulating material 140. In addition, in the circuit board 200 shown in FIG. 2, the thermally conductive plate 220 may be replaced by the thermally conductive plate 120 in FIG. 1. Therefore, the pads 154d and 154w and the thermally conductive plate 220 shown in FIG. 2 are only for example and do not limit the present invention.

Figure 3:
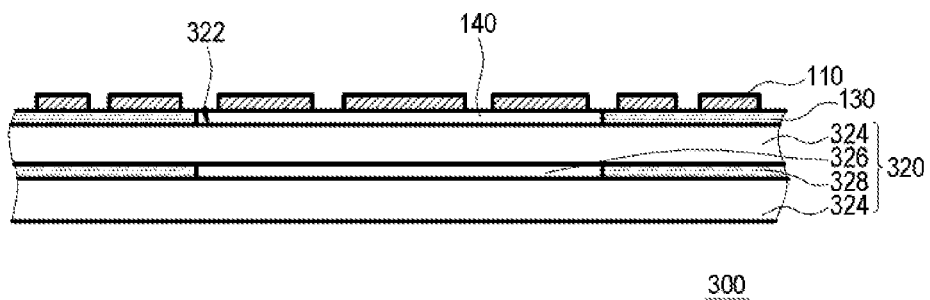
FIG. 3 is a cross-sectional schematic view of a circuit board according to another embodiment of the present invention.

FIG. 3 is a cross-sectional schematic view of a circuit board according to another embodiment of the present invention. Referring to FIG. 3, a circuit board 300 in this embodiment is similar to the circuit board 200 in the above embodiment. For example, both of the circuit board 200 and the circuit board 300 include some identical components, and the electronic component 150 or 250 (referring to FIG. 1 and FIG. 2) may be electrically connected to the metal pattern layer 110 of the circuit board 300 in the manner of flip chip or wire bonding. However, there is a difference between the circuit board 200 and 300, and the difference lies in that: a thermally conductive plate 320 included by the circuit board 300 is different from the thermally conductive plate 220.

Particularly, the thermally conductive plate 320 includes a plurality of thermally conductive substrates 324, at least one thermally conductive pattern 326, and at least one inner electrically insulating layer 328. Both the thermally conductive pattern 326 and the inner electrically insulating layer 328 are disposed between the thermally conductive substrates 324, and the thermally conductive pattern 326 and the inner electrically insulating layer 328 touch the thermally conductive substrates 324, as shown in FIG. 3.

One of the thermally conductive substrates 324 has a plane 322, and the metal pattern layer 110, the electrically insulating layer 130, and the electrically insulating material 140 are all disposed on the plane 322. Both the electrically insulating layer 130 and the electrically insulating material 140 are disposed between the metal pattern layer 110 and the plane 322 and touch the plane 322, in which the electrically insulating layer 130 partially covers the plane 322, and the electrically insulating material 140 covers the plane 322 where is not covered by the electrically insulating layer 130. In addition, in the embodiment in FIG. 3, the electrically insulating material 140 also may touch the metal pattern layer 110.

The thermally conductive substrate 324 has a high thermal conductivity, for example, larger than 1 W/MK, so the thermally conductive substrates 324 can accelerate the thermal energy transfer rate. In addition, each of the thermally conductive substrates 324 may be a metal plate or a carbon-material board, such as a carbon fiber plate or a graphite plate. The metal plate may be an alloy plate or a plate substantially made of a single kind of metal, such as an aluminum-magnesium alloy place, an aluminum plate, or a copper plate.

The material of the thermally conductive pattern 326 may be the same as the material of the electrically insulating material 140 and may be a ceramic layer, a thermal pad, or a thermal adhesive layer. The forming method of the thermally conductive pattern 326 may be the same as the forming method of the electrically insulating material 140, and both the material and the forming method of the inner electrically insulating layer 328 may be the same as those of the electrically insulating layer 130, so both the thermally conductive pattern 326 and the inner electrically insulating layer 328 may be formed in the manner of laminating or printing.

Since the material of the thermally conductive pattern 326 may be the same as the material of the electrically insulating material 140, and the material of the inner electrically insulating layer 328 may be the same as the material of the electrically insulating layer 130, the thermal conductivity of the thermally conductive pattern 326 is larger than the thermal conductivity of the inner electrically insulating layer 328, and thus the thermal energy transfer rate of the thermally conductive pattern 326 is larger than the thermal energy transfer rate of the inner electrically insulating layer 328. In addition, the thermal conductivity of the inner electrically insulating layer 328 may be lower than 1 W/MK. For example, the thermal conductivity of the inner electrically insulating layer 328 may be between 0.3 W/MK and 0.5 W/MK, and the thermal conductivity of the thermally conductive pattern 326 may be larger than 2.0 W/MK.

In view of the above, when the electronic component 150 or 250 electrically connected to the metal pattern layer 110 is in operation, the thermally conductive pattern 326 and the thermally conductive substrates 324 can fast transfer the thermal energy generated by the electronic component 150 or 250. Therefore, the thermally conductive plate 320 can accelerate the thermal energy transfer rate, so as to reduce the probability that the electronic component 150 is overheating.

It should be noted that, although FIG. 3 depicts two thermally conductive substrates 324, only one thermally conductive pattern 326, and only one inner electrically insulating layer 328, in other embodiment, the circuit board 300 may include three or more thermally conductive substrates 324, a plurality of thermally conductive patterns 326, and a plurality of inner electrically insulating layers 328. Each of the thermally conductive patterns 326 and each of the inner electrically insulating layers 328 are located between two adjacent thermally conductive substrates 324. Therefore, the numbers of the thermally conductive substrate 324, the thermally conductive pattern 326, and the inner electrically insulating layer 328 shown in FIG. 3 are only for example and do not limit the present invention.

Figure 4:
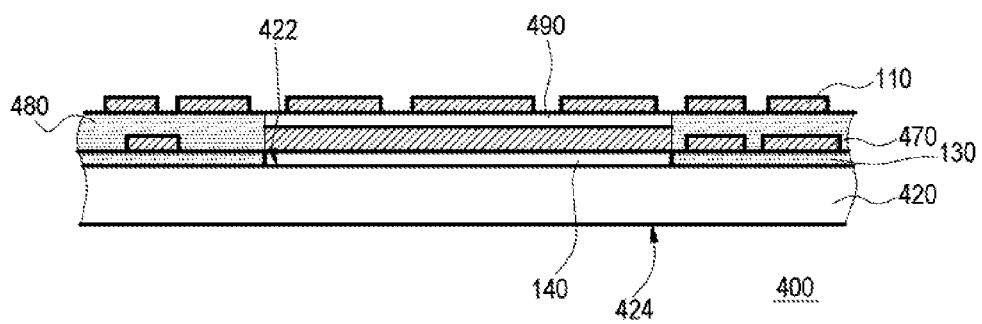
FIG. 4 is a cross-sectional schematic view of a circuit board according to another embodiment of the present invention.

FIG. 4 is a cross-sectional schematic view of a circuit board according to another embodiment of the present invention. Referring to FIG. 4, a circuit board 400 in this embodiment is similar to the circuit board 100 in FIG. 1. For example, both of the circuit board 400 and the circuit board 100 include some identical components, and the electronic component 150 or 250 (referring to FIG. 1 and FIG. 2) may be electrically connected to the metal pattern layer 110 of the circuit board 400 in the manner of flip chip or wire bonding. In order to make the following contents concise, the difference between the circuit board 100 and the circuit board 400 will be mainly described hereinafter, and the same technical features of the circuit board 100 and the circuit board 400 will not be introduced again.

The circuit board 400 includes a metal pattern layer 110, an electrically insulating layer 130, an electrically insulating material 140, a thermally conductive plate 420, at least one inner metal pattern layer 470, at least one outer electrically insulating layer 480, and at least one electrically insulating material 490. The thermally conductive plate 420 can accelerate the thermal energy transfer rate and be the thermally conductive plate 120, 220, or 320 in the above embodiments.

The inner metal pattern layer 470 is disposed between the metal pattern layer 110 and the electrically insulating layer 130, and both the outer electrically insulating layer 480 and the outer electrically insulating material 490 are disposed between the inner metal pattern layer 470 and the metal pattern layer 110. The outer electrically insulating layer 480 covers the inner metal pattern layer 470, and the outer electrically insulating material 490 is located inside the outer electrically insulating layer 480.

The outer electrically insulating layer 480 exposes the outer electrically insulating material 490, and both the outer electrically insulating material 490 and the outer electrically insulating layer 480 may touch the metal pattern layer 110 and the inner metal pattern layer 470 and cover the inner metal pattern layer 470. However, in other embodiment, the electrically insulating material 140 may touch the outer electrically insulating material 490, and the outer electrically insulating material 490 may not touch the inner metal pattern layer 470.

The thermal conductivity of the outer electrically insulating material 490 is larger than the thermal conductivity of the outer electrically insulating layer 480. For example, the thermal conductivity of the outer electrically insulating layer 480 may be lower than 1 W/MK, such as between 0.3 W/MK and 0.5 W/MK, and the thermal conductivity of the outer electrically insulating material 490 may be larger than 2.0 W/MK. Both the material and forming method of the outer electrically insulating material 490 may be the same as those of the electrically insulating material 140, and both the material and forming method of outer electrically insulating material 490 also may be the same as those of the electrically insulating material 140, so that both the outer electrically insulating material 490 and the outer electrically insulating layer 480 may be formed in the manner of laminating or printing.

When the electronic component 150 or 250 electrically connected to the metal pattern layer 110 is in operation, the outer electrically insulating material 490, the electrically insulating material 140, and the thermally conductive substrates 324 can fast transfer the thermal energy generated by the electronic component 150 or 250. Therefore, the outer electrically insulating material 490, the inner metal pattern layer 470, the electrically insulating material 140, and the thermally conductive plate 420 can accelerate the thermal energy transfer rate, so as to reduce the probability that the electronic component 150 is overheating.

It should be noted that, although FIG. 4 depicts one inner metal pattern layer 470, one outer electrically insulating layer 480, and one outer electrically insulating material 490, in other embodiment, the circuit board 400 may include a plurality of inner metal pattern layers 470, a plurality of outer electrically insulating layers 480, and a plurality of outer electrically insulating materials 490.

The outer electrically insulating layers 480 and the inner metal pattern layers 470 may be alternately stacked, and each of the outer electrically insulating materials 490 is located inside one of the outer electrically insulating layers 480. Therefore, the numbers of the inner metal pattern layer 470, the outer electrically insulating layer 480, and the outer electrically insulating material 490 shown in FIG. 4 are only for example and do not limit the present invention.

In addition, there is a circuit board with a symmetrical structure in the technical field of the current circuit board, and the circuit board 400 also may have the symmetrical structure. Particularly, in other embodiment, the circuit board 400 may include a plurality of metal pattern layers 110, a plurality of electrically insulating layers 130, a plurality of electrically insulating materials 140, a plurality, of inner metal pattern layers 470, a plurality of outer electrically insulating layers 480, and a plurality of outer electrically insulating materials 490.

The metal pattern layers 110, the electrically insulating layers 130, the electrically insulating materials 140, the inner metal pattern layers 470, the outer electrically insulating layers 480, and the outer electrically insulating materials 490 respectively take the thermally conductive plate 420 as a symmetry plane and are disposed in two opposite planes 422 and 424 of the thermally conductive plate 420 in line symmetry. The metal pattern layers 110 are disposed in an outermost side of the circuit board 400, and the electrically insulating layers 130 and the electrically insulating materials 140 respectively cover and touch the planes 422 and 424.

Since the symmetrical structure usually appears in some current circuit boards, even if the circuit board 400 with the symmetrical structure is not depicted, people having ordinary skill in the technical field of circuit board can understand the structure of the circuit board 400 with the symmetrical structure according to the embodiments. In other words, even if FIG. 4 does not disclose the circuit board 400 with the symmetrical structure, people having ordinary skill in the technical field of the present invention can know and implement the circuit board 400 with the symmetrical structure according to the above embodiment.

Figure 5A:
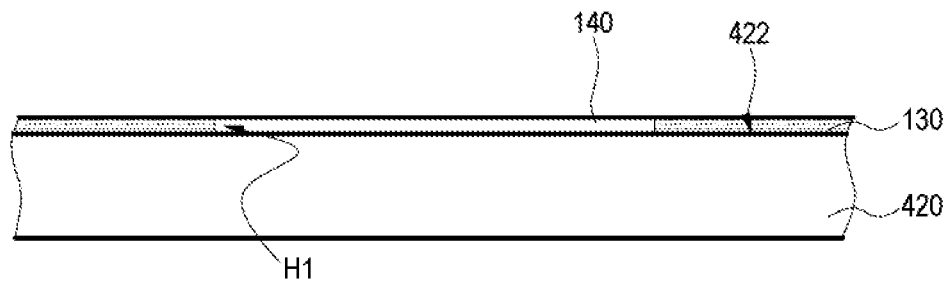
FIG. 5A to FIG. 5C are cross-sectional schematic flow charts of a manufacturing method of a circuit board according to an embodiment of the present invention.
Figure 5B:
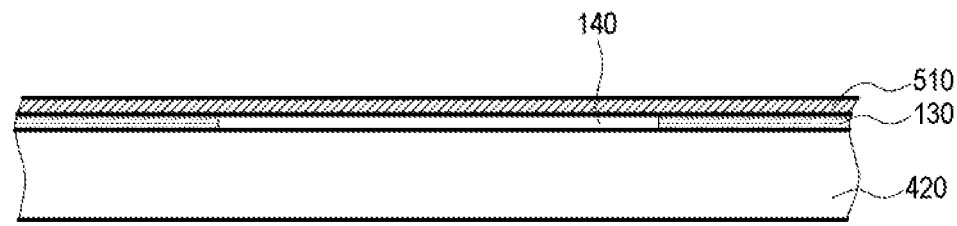
Figure 5C:
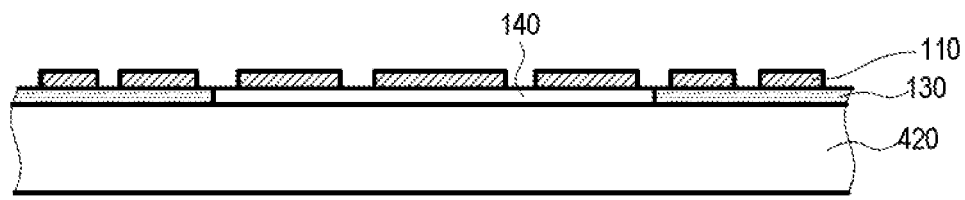

FIG. 5A to FIG. 5C are cross-sectional schematic flow charts of a manufacturing method of a circuit board according to an embodiment of the present invention, and the manufacturing method disclosed in FIG. 5A to FIG. 5C can be used to manufacture the circuit board 100, 200, 300, or 400 in FIG. 1 to FIG. 4. Referring to FIG. 5A, first, the electrically insulating layer 130 and at least one electrically insulating material 140 are formed on the plane 422 of the thermally conductive plate 420. The electrically insulating layer 130 partially covers the plane 422, and the electrically insulating material 140 covers the plane 422 where is not covered by the electrically insulating layer 130 and touches the thermally conductive plate 420.

The electrically insulating layer 130 and the electrically insulating material 140 may be formed by laminating or printing. Particularly, when the electrically insulating layer 130 and the electrically insulating material 140 are formed by laminating, the electrically insulating layer 130 may be a prepreg, and the electrically insulating material 140 may be a thermal pad. In the forming method of the electrically insulating layer 130 and the electrically insulating material 140, first, a prepreg (i.e. the electrically insulating layer 130) with at least one opening H1 is laminated on the plane 422. The opening H1 may be formed by punching or routing the prepreg, or ablating the prepreg by laser.

Then, a thermal pad (i.e. the electrically insulating material 140) is laminated on the plane 422, and the thermal pad is located in the opening H1. The electrically insulating layer 130 and the electrically insulating material 140 may be formed on the plane 422 so far. It can be known from the forming process of the electrically insulating layer 130 and the electrically insulating material 140 that the electrically insulating layer 130 may be formed before the electrically insulating material 140 is formed.

However, it should be noted that, in other embodiment, the thermal pad may be laminated on the plane 422 at first, thereby forming the electrically insulating material 140. Then, the prepreg with the opening H1 is laminated on the plane 422, so as to form the electrically insulating layer 130, so that the electrically insulating layer 130 also may be formed after the electrically insulating material 140 is formed. Therefore, the order for forming the electrically insulating layer 130 and the electrically insulating material 140 is not limited in the present invention.

When the electrically insulating layer 130 and the electrically insulating material 140 are formed by printing, the electrically insulating material 140 may be a ceramic layer or a thermal adhesive layer, and the electrically insulating layer 130 may be a resin layer. The electrically insulating layer 130 and the electrically insulating material 140 may be formed by applying a liquid, colloidal, or paste-like coating.

The method of forming the electrically insulating layer 130 and the electrically insulating material 140 may include applying two kinds of coatings. One of the coatings is used for forming the electrically insulating layer 130, and the other one is used for forming the electrically insulating material 140. In addition, the coatings may be applied on the plane 422, and after the coating is applied, the coating may be heated and dried or illuminated by light to cure the coating, in which the light may be ultraviolet light.

Referring to FIG. 5B, then, a metal foil 510 is laminated on the electrically insulating layer 130 and the electrically insulating material 140. The metal foil 510 is, for example, a copper foil, an aluminum foil, a tin foil, a silver foil, a gold foil, or a resin coated copper (RCC).

Referring to FIG. 5B to FIG. 5C, after the metal foil 510 is laminated, a part of the metal foil 510 is removed, so as to form the metal pattern layer 110 on the electrically insulating layer 130. The method of removing a part of the metal foil 510 may include lithography and etching. So far, the manufacturing of a circuit board 500 which can accelerate the thermal energy transfer rate is basically completed.

It should be noted that, in addition to the method of forming the metal pattern layer 110 disclosed in FIG. 5B and FIG. 5C, the metal pattern layer 110 also may be formed in other methods without laminating, lithography, and etching. For example, the method of forming the metal pattern layer 110 may include electroless plating and electroplating. Therefore, the metal pattern layer 110 also may be formed.

Figure 6A:
FIG. 6A to FIG. 6C are cross-sectional schematic flow charts of a manufacturing method of a circuit board according to another embodiment of the present invention.
Figure 6B:
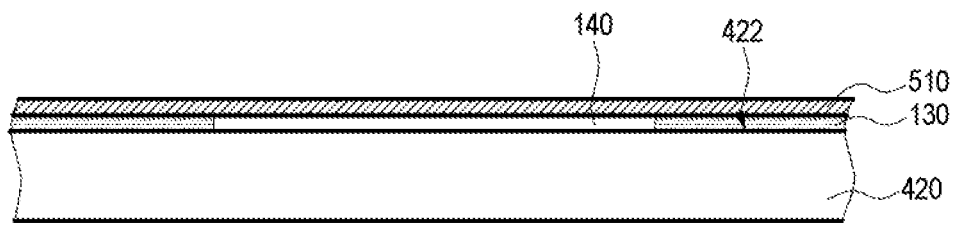
Figure 6C:
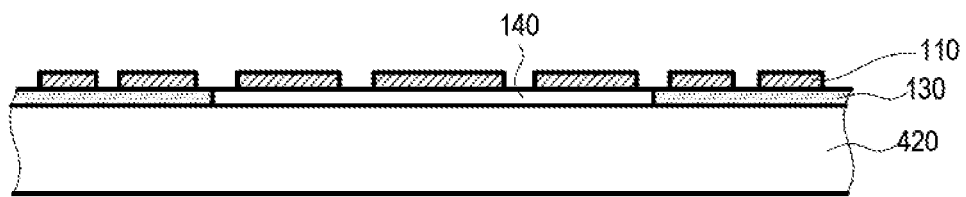

FIG. 6A to FIG. 6C are cross-sectional schematic flow charts of a manufacturing method of a circuit board according to another embodiment of the present invention, and the manufacturing method disclosed in FIG. 6A to FIG. 6C can be used to manufacture the circuit board 100, 200, 300, or 400 in FIG. 1 to FIG. 4. Referring to FIG. 6A, first, the electrically insulating layer 130 and the electrically insulating material 140 are formed on the metal foil 510. Both the electrically insulating layer 130 and the electrically insulating material 140 touch the metal foil 510. The electrically insulating layer 130 and the electrically insulating material 140 may be formed by applying two kinds of coatings to the metal foil 510, and both the coatings may be sticky and contain the resin.

Referring to FIG. 6B, then, the thermally conductive plate 420 is provided, and the metal foil 510 is laminated on the plane 422 of the thermally conductive plate 420. The electrically insulating layer 130 and the electrically insulating material 140 are located between the metal foil 510 and the plane 422. Since the coatings for forming the electrically insulating layer 130 and the electrically insulating material 140 are viscous, both the electrically insulating layer 130 and the electrically insulating material 140 may bind the metal foil 510 with the thermally conductive plate 420 after the metal foil 510 is laminated.

Referring to FIG. 6B and FIG. 6C, after the metal foil 510 is laminated, a part of the metal foil 510 is removed, so as to form the metal pattern layer 110. The method of removing a part of the metal foil 510 may include lithography and etching. So far, the manufacturing of a circuit board 600 which can accelerate the thermal energy transfer rate is basically completed.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A circuit board, comprising:
at least one metal pattern layer;
a thermally conductive plate, having a plane;
at least one electrically insulation layer, disposed between the metal pattern layer and the plane and partially covering the plane; and
at least one electrically insulating material, covering the plane without covered by the electrically insulating layer, and contacting with the thermally conductive plate, wherein the electrically insulation layer exposes the electrically insulating material, and the side surface of the electrically insulating material contact the side surface of the electrically insulting layer,
wherein thermal conductivity of the electrically insulating material is larger than a thermal conductivity of the electrically insulating layer,
wherein both the electrically insulation layer and the electrically insulating material are disposed between the circuit layer and the plane,
wherein the height of the electrically insulation layer is equal to the height of the electrically insulating material,
wherein both the electrically insulating layer and the electrically insulating material cover the plane entirely.

2. The circuit board according to claim 1, wherein the thermally conductive plate comprises a thermally conductive layer and a main body layer, and the thermally conductive layer is located between the main body layer and the electrically insulating layer and touches the electrically insulating material.

3. The circuit board according to claim 1, wherein the thermally conductive plate comprises:
a plurality of thermally conductive substrates, wherein one of the thermally conductive substrates has the plane;
at least one thermally conductive pattern, disposed between the thermally conductive substrates; and
at least one inner electrically insulating layer, disposed between the thermally conductive substrates, wherein both the thermally conductive pattern and the inner electrically insulating layer touch the thermally conductive substrates, and a thermal conductivity of the thermally conductive pattern is larger than a thermal conductivity of the inner electrically insulating layer.

4. The circuit board according to claim 1, wherein the electrically insulating material further touches the metal pattern layer.

5. The circuit board according to claims 1, further comprising:
at least one inner metal pattern layer, disposed between the metal pattern layer and the electrically insulating layer;
at least one outer electrically insulating layer, disposed between the inner metal pattern layer and the metal pattern layer, and covering the inner metal pattern layer; and
at least one outer electrically insulating material, disposed between the inner metal pattern layer and the metal pattern layer and located inside the outer electrically insulating layer, wherein a thermal conductivity of the outer electrically insulating material is larger than that of the outer electrically insulating layer.

6. The circuit board according to claim 5, wherein both the outer electrically insulating material and the outer electrically insulating layer touch the metal pattern layer and the inner metal pattern layer.

7. The circuit board according to claim 1, further comprising at least one electronic component, wherein the electronic component comprises:
a component main body, having a bottom surface; and
a plurality of pads, disposed on the bottom surface and electrically connected to the metal pattern layer, wherein at least one of the pads is thermally coupled to the electrically insulating material.

8. The circuit board according to claim 7, further comprising a plurality of solders connected to the electronic component and the thermally conductive plate, wherein each solder is connected to one of the pads, and the solders touch the pads and the metal pattern layer.

9. The circuit board according to claim 7, wherein an area of the bottom surface is smaller than an area of the plane covered by the electrically insulating material.

10. The circuit board according to claim 7, wherein an area of the bottom surface is larger than an area of the plane covered by the electrically insulating material.

11. The circuit board according to claim 10, wherein the component main body further has a side surface connected to the bottom surface, and the electrically insulating material does not protrude from the side surface.

* * * * *